United States Patent
Manabe et al.

(10) Patent No.: US 10,103,193 B1
(45) Date of Patent: Oct. 16, 2018

(54) APPARATUS AND METHOD FOR LOW DARK CURRENT FLOATING DIFFUSION

(71) Applicant: OMNIVISION TECHNOLOGIES, INC., Santa Clara, CA (US)

(72) Inventors: Sohei Manabe, San Jose, CA (US); Keiji Mabuchi, Los Altos, CA (US); Takayuki Goto, Foster City, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/668,207

(22) Filed: Aug. 3, 2017

(51) Int. Cl.
*H01L 25/00* (2006.01)
*H01L 27/146* (2006.01)

(52) U.S. Cl.
CPC .. *H01L 27/14643* (2013.01); *H01L 27/14614* (2013.01); *H01L 27/14689* (2013.01)

(58) Field of Classification Search
CPC ........ H04N 5/32; H04N 5/2353; H04N 5/361; H05G 1/30; A61B 6/542; A61B 6/4233
See application file for complete search history.

(56) References Cited

U.S. PATENT DOCUMENTS

| | | | | |
|---|---|---|---|---|
| 6,046,444 A * | 4/2000 | Afghahi | ................. | G11C 7/005 250/208.1 |
| 6,133,862 A * | 10/2000 | Dhuse | .................... | H04N 5/363 341/118 |
| 6,570,615 B1 * | 5/2003 | Decker | ................ | H04N 5/3692 250/208.1 |
| 9,787,923 B2 * | 10/2017 | Petilli | .................. | H04N 5/3696 |
| 2005/0057680 A1 * | 3/2005 | Agan | ................... | H04N 5/3532 348/362 |
| 2008/0266434 A1 * | 10/2008 | Sugawa | ............ | H01L 27/14609 348/308 |
| 2009/0128677 A1 * | 5/2009 | Kozlowski | ......... | H04N 5/23245 348/308 |
| 2013/0020466 A1 * | 1/2013 | Ayers | ................ | H01L 27/14609 250/208.1 |
| 2014/0078336 A1 * | 3/2014 | Beck | ...................... | H04N 5/225 348/222.1 |
| 2015/0055752 A1 * | 2/2015 | Takahashi | ................ | H04N 5/32 378/62 |
| 2015/0189199 A1 * | 7/2015 | Borremans | .......... | H04N 5/3559 348/250 |
| 2017/0264838 A1 * | 9/2017 | Maes | .................... | H04N 5/3559 |

* cited by examiner

*Primary Examiner* — Kho Kim
(74) *Attorney, Agent, or Firm* — Christensen O'Connor Johnson Kindness PLLC

(57) ABSTRACT

An apparatus and method for a low dark current floating diffusion is discussed. An example method includes coupling a photodiode to a floating diffusion through a transfer gate where a gate terminal of the transfer gate is provided a first voltage, resetting the floating diffusion, repetitively sampling image charge on the photodiode a plurality of times, where the sampled image charge is coupled to the floating diffusion, and where the gate terminal of the transfer gate is provided a second voltage less than the first voltage during each sampling of the image charge, while repetitively sampling the image charge, coupling an additional capacitance to the floating diffusion, where a first capacitance voltage is applied to the additional capacitance during the sampling, and performing correlated double sampling of the sampled image charge.

20 Claims, 4 Drawing Sheets

APPARATUS AND METHOD FOR LOW DARK CURRENT FLOATING DIFFUSION

TECHNICAL FIELD

This disclosure relates generally to image sensors, and in particular but not exclusively, relates to low dark current CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Pixel crosstalk currently limits performance of semiconductor image sensor devices. Ideally each pixel in an image sensor operates as an independent photon detector. In other words, electron/hole content in one pixel does not spill into neighboring pixels (or any other pixels in the device). In real image sensors, this is not the case. Electrical signals may move from one pixel to another. This crosstalk may increase the number of white pixels, reduce image sensor sensitivity, and cause color-signal mixing. Unfortunately, many solutions to crosstalk often exaggerate the effects of dark current or contribute to it. The combination of dark current and crosstalk may lead to appreciable image degradation.

Many techniques have been employed to mitigate the effects of crosstalk/dark current and enhance image sensor performance. However, some of these methods may not entirely eliminate the effects of pixel crosstalk and dark current.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
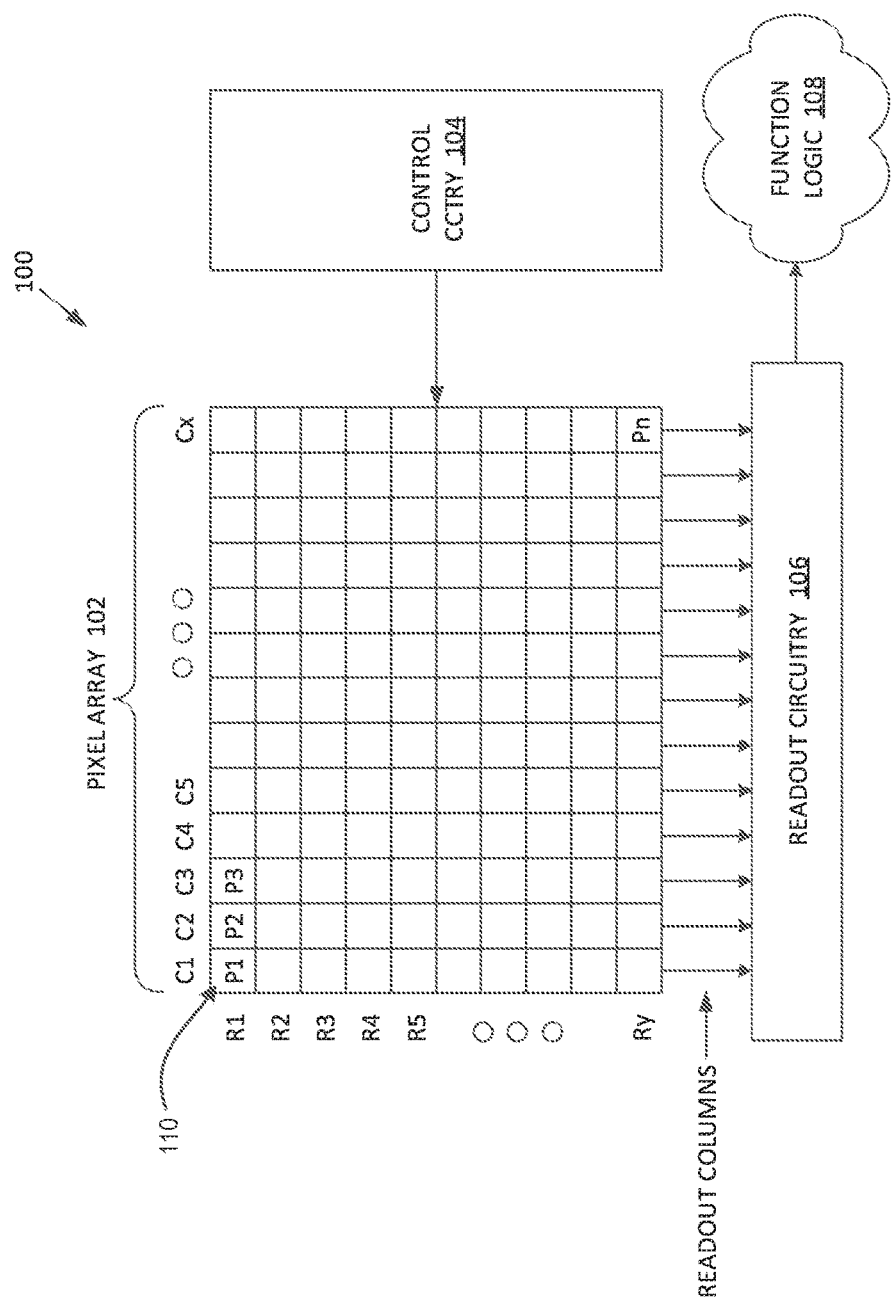
FIG. 1 illustrates one example of an imaging system 100 according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with a floating diffusion operation to obtain low dark current are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 according to an embodiment of the present disclosure. Imaging system 100 includes pixel array 102, control circuitry 104, readout circuitry 106, and function logic 108. In one example, pixel array 102 is a two-dimensional (2D) array of photodiodes 110, or image sensor pixels (e.g., pixels P1, P2..., Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 106 and then transferred to function logic 108. Readout circuitry 106 may be coupled to readout image data from the plurality of photodiodes 110 in pixel array 102. In various examples, readout circuitry 106 may include amplification circuitry, analog-to-digital (ADC) conversion circuitry, or otherwise. Function logic 108 may simply store the image data or even manipulate the image data by applying post image effects (e.g., crop, rotate, remove red eye, adjust brightness, adjust contrast, or otherwise). In one example, readout circuitry 106 may readout a row of image data at a time along readout column lines (illustrated) or may readout the image data using a variety of other techniques (not illustrated), such as a serial readout or a full parallel readout of all pixels simultaneously.

In one example, control circuitry 104 is coupled to pixel array 102 to control operation of the plurality of photodiodes 110 in pixel array 102. For example, control circuitry 104 may generate a shutter signal for controlling image acquisition. In one example, the shutter signal is a global shutter signal for simultaneously enabling all pixels 110 within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, the control circuit 104 may control the timing of various control signals provided to the pixel 110 to reduce the dark current associated with floating diffusions of each of the pixels 110. The pixels 110, in some non-limiting embodiments, may be what are known as 4T pixels, e.g., four-transistor pixels, and the timing of the various transistors may be choreographed to reset the floating diffusion, transfer photogenerated charge from a photodiode to the floating diffusion, and such. The order and relative timing of the various control signals may impact the dark current associated with the floating diffusion, for example. Additionally, the pixels 110 may further include a dual conversion gain (DCG) transistor and an associated capacitor. The associated capacitor may be coupled to the floating diffusion to increase the capacitance of the floating diffusion, which may additionally reduce the conversion gain. Reduction of the conversion gain may be beneficial in high light intensity scenarios, for example. Further, during an integration, the additional capacitance may be modulated while a partial voltage is applied to a transfer gate of a respective pixel 110. Applying the partial voltage to the transfer gate may allow sampling of the photogenerated charge, e.g., image charge, of the photodiode. Sampling the image charge while modulating the associated capacitance may reduce the dark current associated with the floating diffusion.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
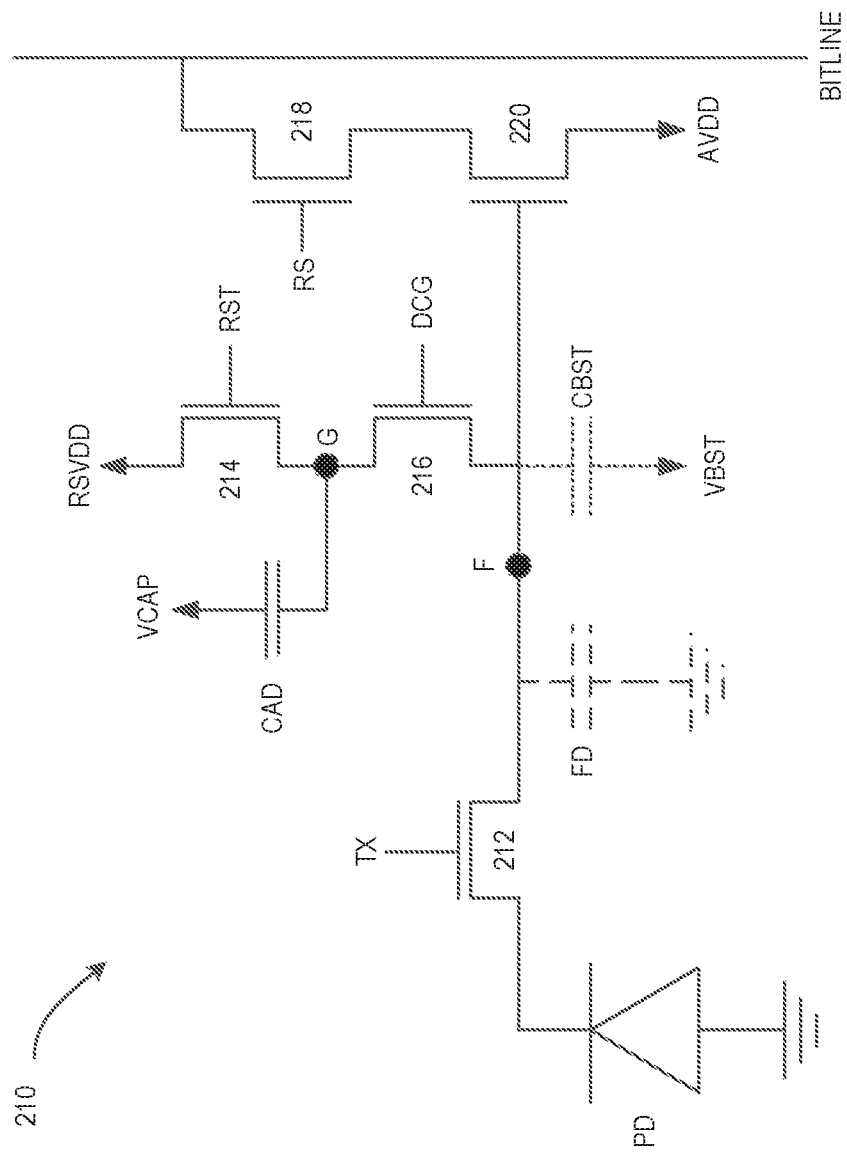
FIG. 2 is an illustrative schematic of a pixel 210 in accordance with an embodiment of the present disclosure.

FIG. 2 is an illustrative schematic of a pixel 210 in accordance with an embodiment of the present disclosure. The pixel 210 may be an example of the pixels 110. The pixel 210 may be coupled to a bitline, e.g., readout column, which may provide image data to readout circuitry, such as the readout circuitry 106, and the pixel 210 may receive control signals from control circuitry, such as control circuitry 104, to control the operation of the various transistors of the pixel 210. The control circuitry may control the operation of the transistors in desired sequences with relative timing in order to reset the pixel to a dark state, for example, and to read out image data after an integration, for example.

The illustrated embodiment of the pixel 210 includes a photodiode PD, a floating diffusion FD, a transfer transistor 212, a control transistor 216, an additional capacitance CAD, a reset transistor 214, a row select transistor 218, and a source follower transistor 220. An optional boost capacitor CBST may be included in the pixel 210. The transfer transistor 212, which may also be referred to as a transfer gate 212, is coupled between the photodiode PD and the floating diffusion FD, and may be coupled to receive a TX control signal on a gate terminal. While the floating diffusion FD is depicted as a capacitor coupled between a node F and ground, the entirety of node F may also be referred to as the floating diffusion. The node F may form a capacitor to ground and be the floating diffusion FD in some embodiments.

The reset transistor 214 may be coupled between a reference voltage RSVDD and a node G, and may further be coupled to receive a reset control signal on a gate terminal. The additional capacitance CAD may be coupled between a variable reference voltage VCAP and the node G. The control transistor 216 may be coupled between nodes G and F, and further coupled to receive a DCG (dual conversion gain) control signal on a gate terminal. Further, a gate terminal of the source follower transistor 220 is coupled to node F, and further coupled between a high reference voltage AVDD and the row select transistor at source/drain terminals. The row select transistor 218 may be coupled between the bitline and the source follower transistor 220, and is coupled to receive a control signal RS on a gate terminal.

The transfer gate 212 is coupled to receive the control signal TX to enable the transfer gate 212 so that charge may be transferred to the floating diffusion FD. The amount of charge may depend on a current operation of the pixel 210. For example, during a reset operation, the charge may be charge generated in a dark state of the photodiode PD, but during an integration, the charge may be photogenerated image charge. The floating diffusion FD may be a capacitor coupled to ground that temporarily stores the image charge as an image voltage before being readout via the bitline. The optional boost capacitor CBST may be added to increase the capacitance, e.g., capacity, of the floating diffusion FD. For example, in response to high intensity illumination, the photodiode PD may generate more charge than the floating diffusion FD can store. As such, the boost capacitor CBST may be enabled by a reference voltage VBST to add extra capacitance to the floating diffusion FD to store the extra charge. In some embodiments, the reference voltage VBST may be modulated between two or more voltage levels, which may affect whether charge is stored on CBST.

The reset transistor 214 may receive the control signal RST to reset the floating diffusion to the voltage RSVDD. The floating diffusion FD may be reset to a high voltage that represents a dark state because photogenerated electrons, when transferred to the floating diffusion FD, decrease the voltage proportional to the intensity of the image charge. However, to reset the floating diffusion FD, both the reset transistor 214 and the control transistor 216 may be enabled by respective control signals RST and DCG. The two control signals RST and DCG may be independently provided and the DCG control signal may be provided at times when the RST control signal is not provided. For example, the DCG control signal may be provided to the control transistor 216 to couple node F, and hence the floating diffusion FD, to the additional capacitor CAD.

The variable voltage VCAP coupled to the additional capacitor CAD may be modulated between two or more voltage levels during an integration. For example, VCAP may be modulated between around 0.4V to around 1.8V. Of course, other voltage levels may be implemented depending on the underlying semiconductor materials. The coupling of the additional capacitor CAD to the floating diffusion FD when the control transistor 216 is enabled may provide additional capacitance to the floating diffusion FD. For example, when the control signal TX enables the transfer gate 212 to transfer image charge to the floating diffusion FD, the control transistor 216 may be enabled to couple the additional capacitance to the floating diffusion FD to increase the full well capacity (FWC) of the floating diffusion, which may reduce dark current. In some embodiments, the variable voltage VCAP may be at a higher voltage when the transfer gate is enabled, and at a lower voltage when disabled.

In some embodiments, the TX control signal may be provided to the transfer gate 212 at two more voltage levels. For example, the TX control signal may be at a full voltage, e.g., to drive the transfer gate into saturation, at some intervals, but may be at a reduced voltage at other intervals. The reduced voltage may allow image charge to be "sampled" onto the floating diffusion FD. The reduced voltage may not be high enough to drive the transfer gate 212 into saturation, but it may be high enough to expedite "leakage" from the photodiode PD to the floating diffusion FD. In should be noted that image charge, e.g., electrons, may also leak from the photodiode PD to the floating diffusion FD even when the transfer gate 212 is disabled.

In some embodiments, the TX control signal and the reference voltage VCAP may be modulated in unison. The TX control signal may be modulated from zero to the reduced voltage VTXS and VCAP may be modulated between the low and high voltages discussed above. During the modulation, VCAP may be driven to the high voltage in unison with TX being driven to the reduced voltage, and VCAP may be reduced to the low voltage when TX is reduced to zero. During this time, the DCG control signal may be similarly modulated so that the control transistor 216 is enabled/disabled in concert with the application/removal of VCAP and TX. By modulating, e.g., pulsing, TX, VCAP, and DCG, the image charge may be slowly transferred to the floating diffusion FD and overflow charge may be stored on CAD. Additionally, by maintaining a positive voltage on VCAP, e.g., 0.4V, the image charge on the floating diffusion FD may be prevented from leaking back into the photodiode PD.

At the end of an integration, the image charge may be readout twice with one or more dark readings occurring between the two to perform correlated double sampling (CDS).

Figure 3:
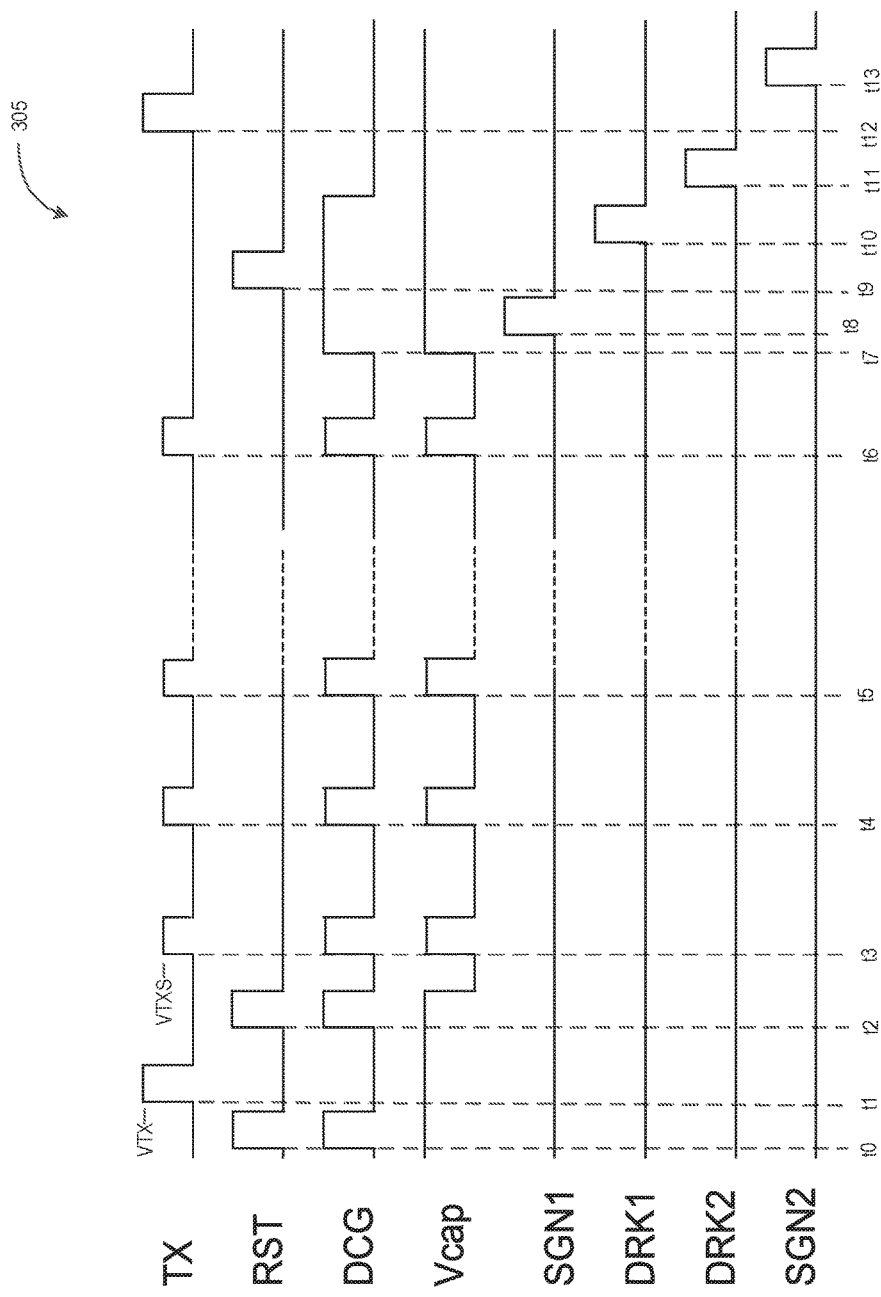
FIG. 3 is an example timing diagram 305 in accordance with an embodiment of the present disclosure.

FIG. 3 is an example timing diagram 305 in accordance with an embodiment of the present disclosure. Timing diagram 305 may depict an example operation of the pixel 210. The various control signal of the timing diagram 305 are provided by control circuitry, such as the control circuitry 104, and the various readout signals are received by readout circuitry, such as readout circuitry 106. The timing diagram 305 illustrates an operation of one or more pixels 210 that may result in large FWC, wide dynamic range, low dark current, and reduced or eliminated motion blur.

The timing diagram 305 may begin at time t0, which includes applying RST and DCG control signal pulses to the reset and control transistors 214 and 216, respectively. While the RST and DCG control signals are applied to their respective transistors, the floating diffusion FD may be coupled to RSVDD resulting in resetting the floating diffusion FD. Resetting the floating diffusion FD may result in extracting any free electrons that may be stored on node F.

At time tithe transfer control signal TX is provided to the transfer gate 212. The control signal TX at time t1 may be provided at a high voltage, labeled VTX. The voltage VTX may be high enough to drive the transfer gate 212 into saturation so that any charge in the PD is quickly coupled to the floating diffusion FD. While TX applies VTX to the transfer gate 212, the dark current is removed from PD and the PD is reset and readied for an integration.

At time t2 the RST and DCG control signal pulses are applied again to rest the floating diffusion FD after the prior dark current transfer. It should be noted that from time t0 through time t2 that the voltage VCAP applied to the capacitor CAD is at a high voltage reducing the charge that may be stored on CAD. In some embodiments, CAD may store no charge during this time due to VCAP being close to or similar to RSVDD. After the PD and FD are reset, the pixel 210 may be in an integration process, e.g., receiving image light to generate image charge.

At time t3, the control signals TX, RST, and DCG all provide a short pulse, and the voltage VCAP on CAD may be increased for a time period commensurate with the pulses of the control signals. The TX control signal, however, is provided at a reduced voltage level, such as VTXS. The voltage level VTXS may enable the transfer gate 212, but not drive the transfer gate 212 into saturation. As such, image charge generated during the integration may be sampled into the floating diffusion FD. Additionally, the voltage on VCAP may be at a high voltage, which may increase the electron draw of CAD. After the control signal pulses end and VCAP is reduced, a time period occurs where potential on the floating diffusion FD is low due to the prior boost to VCAP, and which may result in reduced leakage current from the floating diffusion FD.

At times t4, t5, and t6, the control signal pulses TX, RST, and DCG, and the voltage VCAP is applied as performed at time t3. While the timing diagram only shows three instances of the pulses after time t3, the number of pulses may be N, where N may depend on an operating environment of a host imaging system. As a result, the image charge is slowly sampled onto the floating diffusion while maintaining a condition that provides for low leakage current from the floating diffusion. Accordingly and due to the sampling of the image charge, low dark current occurs and limited or no motion blur occurs. Additionally, the added capacitance CAD may increase the FWC of the pixel 210 and allow for a wide dynamic range. In some embodiments, the optional capacitance CBST may add to the FWC and the wide dynamic range.

Starting at time t7 and extending through time t13, a correlated double sampling procedure may occur that includes a double dark current measurement. Of course, a single dark current measurement may also be implemented. Specifically, at time t7 the DCG control signal is applied and the voltage VCAP is increased before signal SGN1 is readout via the bitline at time t8. While not shown, the row select signal RS is also applied at time t8 to turn on the source follower transistor 220, which couples the image voltage on the floating diffusion to the bitline thereby generating image data.

At time t9, the RST control signal is applied, which resets the floating diffusion FD. At times t10 and t11, dark signals DRK1 and DRK2 are serially readout to the bitline. However, dark signal DRK1 may be readout while the DCG control signal is applied and the voltage on VCAP is high. It should be noted, that the first signal SGN1 and the first dark signal DRK1 are readout when the pixel 210 is in a low gain state due to the DCG (i.e., dual conversion gain) control signal being applied. By extension, the signals DRK2 and SGN2 are readout in a high gain state. To continue, at time t12, the control signal TX is applied at a full voltage to couple the floating diffusion FD to the photodiode for the second signal generation, which is then readout at time t13.

Figure 4:
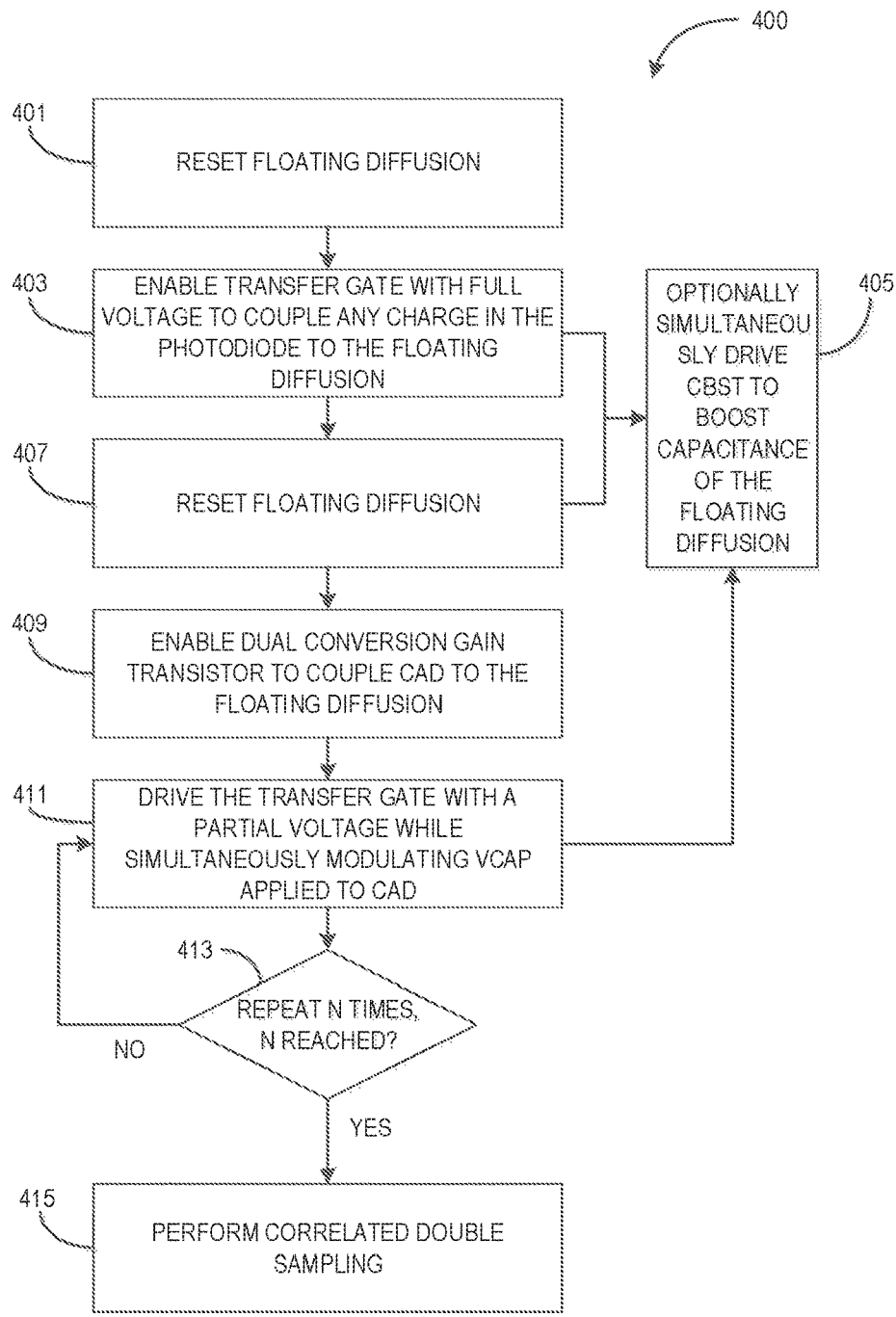
FIG. 4 is an example flow chart 400 in accordance with an embodiment of the present disclosure.

FIG. 4 is an example flow chart 400 in accordance with an embodiment of the present disclosure. The flow chart 400 illustrates an example operation of a pixel, such as the pixel 210, to provide a pixel with large FWC, wide dynamic range, low dark current, and little or no motion blur. The flow chart 400 may be implemented in an imaging system, such as the imaging system 100.

The method 400 begins at process block 401, which includes resetting a floating diffusion. Resetting the floating diffusion may include coupling the floating diffusion to a high voltage source such as RSVDD. Resetting the floating diffusion may result in removing any charge.

The process block 401 may be followed by the process block 403, which includes enabling a transfer gate with a full voltage to couple any charge in a photodiode to the floating diffusion. Coupling the photodiode to the floating diffusion may reset the photodiode. Process block 403 may be followed by process block 407, which includes resetting the floating diffusion. The process block 407 may be analogous to the process block 401, and result in removing any charge from the floating diffusion that had been transferred from the photodiode in process block 405.

The process block 405 may optionally be followed by process block 403 and/or process block 407. The process block 405 includes simultaneously driving a boost capacitor CBST that is coupled to the floating diffusion FD. Driving the boost capacitance CBST may increase the FWC of the floating diffusion FD, in some embodiments.

The process block 407 may be followed by the process block 409, which includes enabling the dual conversion gain transistor, e.g., control transistor 216, to couple the additional capacitance CAD to the floating diffusion. Coupling the capacitance CAD to the floating diffusion may similarly increase the FWC and may additionally reduce leakage current from the floating diffusion FD.

The process block 409 may be followed by process block 411, which includes driving the transfer gate with a partial voltage while, e.g., VTXS, simultaneously modulating a VCAP voltage applied to the additional capacitance CAD. It should additionally be noted that the control signal DCG may be simultaneously modulated along with VCAP and the control signal TX so that CAD is coupled to the floating diffusion for a length of time VTXS and VCAP are applied.

The process block 411 may be followed by process block 413, which includes a determination as to whether process block 411 has been repeated N times. If not, then process block 411 is repeated, else the method 400 moves on to process block 415. Process block 415 includes performing a correlated double sampling process that includes at least two dark signal readings. The method 400 may then be repeated for each row or column of a pixel array of an imaging system.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method comprising:
   coupling a photodiode to a floating diffusion through a transfer gate, wherein a gate terminal of the transfer gate is provided a first voltage;
   resetting the floating diffusion;
   repetitively sampling image charge on the photodiode a plurality of times, wherein the sampled image charge is coupled to the floating diffusion of the pixel, and wherein the gate terminal of the transfer gate is provided a second voltage less than the first voltage during each sampling of the image charge;
   while repetitively sampling the image charge, coupling an additional capacitance to the floating diffusion, wherein a first capacitance voltage is applied to the additional capacitance during the sampling; and
   performing correlated double sampling of the sampled image charge.

2. The method of claim 1 further comprising:
   repetitively enabling a control transistor to couple the additional capacitance to the floating diffusion during each sampling of the image charge.

3. The method of claim 1, wherein the first voltage drives the transfer gate into a saturation mode.

4. The method of claim 1 further comprising:
   coupling a second additional capacitance to the floating diffusion during each sampling of the image charge.

5. The method of claim 1, wherein performing correlated double sampling of the sampled image charge comprises:
   coupling the additional capacitance to the floating diffusion;
   providing the first capacitance voltage to the additional capacitance; and
   enabling a row select transistor to couple the floating diffusion to a bitline via a source-follower transistor, wherein the image charge on the floating diffusion is read out as a first signal.

6. The method of claim 5 further comprising:
   resetting the floating diffusion;
   coupling the additional capacitance to the floating diffusion;
   providing the first capacitance voltage to the additional capacitance; and
   enabling a row select transistor to couple the floating diffusion to a bitline via a source-follower transistor, wherein charge on the floating diffusion is read out as a first dark signal.

7. The method of claim 6 further comprising:
   enabling a row select transistor to couple the floating diffusion to a bitline via a source-follower transistor, wherein charge on the floating diffusion is read out as a second dark signal.

8. The method of claim 7 further comprising;
   coupling the photodiode to the floating diffusion, wherein the first voltage is provided to the gate terminal of the transfer gate; and
   enabling a row select transistor to couple the floating diffusion to a bitline via a source-follower transistor, wherein charge on the floating diffusion is read out as a second signal.

9. An imaging system comprising:
   an array of pixels to photogenerate image charge, wherein each pixel includes:
   a photodiode;
   a floating diffusion coupled to the photodiode via a transfer gate;
   an additional capacitance coupled to the floating diffusion via a control gate;
   control circuitry coupled to control the array of pixels, wherein the control circuitry provides two or more control signals to the array of pixels to sample the image charge, the control signals causing at least one pixel to:
   couple the photodiode to the floating diffusion through the transfer gate, wherein a gate terminal of the transfer gate is provided a first voltage;
reset the floating diffusion;
   repetitively sample image charge on the photodiode a plurality of times, wherein the sampled image charge is coupled to the floating diffusion of the pixel, and wherein the gate terminal of the transfer gate is provided a second voltage less than the first voltage during each sampling of the image charge; and
   while repetitively sampling the image charge, couple the additional capacitance to the floating diffusion through the control gate, wherein a first capacitance voltage is applied to the additional capacitance during the sampling.

10. The imaging system of claim 9, wherein the control circuitry further causes the control signal to perform correlated double sampling on the at least one pixel.

11. The imaging system of claim 10, wherein to perform correlated double sampling includes:
   obtaining a first image signal with the additional capacitance coupled to the floating diffusion;
   obtaining a first dark signal with the additional capacitance coupled to the floating diffusion;
   obtaining a second dark signal without the additional capacitance coupled to the floating diffusion; and
   obtaining a second image signal without the additional capacitance coupled to the floating diffusion.

12. The imaging system of claim 11, further including readout circuitry coupled to receive the first and second image signals and the first and second dark signals.

13. The imaging system of claim 9, wherein the control signals further cause the at least one pixel to:
   couple the floating diffusion to a reference voltage via the control gate and a reset transistor to reset the floating diffusion prior to an integration.

14. A method of comprising:
   enabling a transfer gate to transfer charge from a photodiode to a floating diffusion, wherein the transfer gate is enabled with a first voltage;
   enabling a reset transistor and a control transistor to couple the floating diffusion to a high reference voltage;
   iteratively enabling the transfer gate and the control gate to sample image charge from the photodiode to the floating diffusion, wherein the transfer gate is enabled with a second voltage less than the first voltage, and wherein enabling the control gate couples a first additional capacitance to the floating diffusion;
   while iteratively enabling the transfer gate and the control gate, iteratively applying a first capacitance voltage to the additional capacitance; and
   performing correlated double sampling on the image charge including two dark signals.

15. The method of claim 14, wherein, while the transfer gate and the control gate are disabled, a second capacitance voltage is applied to the additional capacitance, the second capacitance voltage being less than the first capacitance voltage.

16. The method of claim 14, further comprising generating the image charge by the photodiode during an integration.

17. The method of claim 16, wherein the first voltage drives the transfer gate into a saturation mode, and wherein the second voltage causes the image charge to leak out of the photodiode.

18. The method of claim 14, wherein performing correlated double sampling includes resetting the floating diffusion between reading out a first dark signal and reading out a second dark signal.

19. The method of claim 14, wherein performing correlated double sampling includes:
   reading out a first signal while the control gate is enabled;
   reading out a first dark signal while the control gate is enabled;
   reading out a second dark signal while the control gate is disabled; and
   reading out a second signal while the control gate is disabled.

20. The method of claim 19, further comprising:
   while reading out the first signal and the first dark signal, providing the first capacitance voltage to the additional capacitance.

* * * * *